United States Patent [19]

Rodov

[11] 4,140,560
[45] Feb. 20, 1979

[54] PROCESS FOR MANUFACTURE OF FAST RECOVERY DIODES

[75] Inventor: Vladimir Rodov, Los Angeles, Calif.

[73] Assignee: International Rectifier Corporation, Los Angeles, Calif.

[21] Appl. No.: 807,888

[22] Filed: Jun. 20, 1977

[51] Int. Cl.$^2$ .......................................... H01L 21/225
[52] U.S. Cl. .................................... 148/188; 148/187; 148/190; 357/63
[58] Field of Search ............... 148/186, 187, 190, 188; 357/63

[56] References Cited

U.S. PATENT DOCUMENTS

| | | | |
|---|---|---|---|
| 3,184,347 | 5/1965 | Hoerni | 148/33 |
| 3,244,566 | 4/1966 | Mann et al. | 148/186 |
| 3,356,543 | 12/1967 | Desmond et al. | 148/186 |
| 3,486,950 | 12/1969 | Lesk | 148/187 X |
| 3,625,781 | 12/1971 | Jashi et al. | 148/189 |
| 3,645,808 | 2/1972 | Kamiyama et al. | 148/187 |

*Primary Examiner*—G. Ozaki
*Attorney, Agent, or Firm*—Ostrolenk, Faber, Gerb & Soffen

[57] ABSTRACT

A high speed or fast recovery diode having soft turn-off characteristics has gold atoms diffused in a silicon wafer to reduce minority carrier lifetime. The gold atom density gradient is relatively high across the thickness of the wafer. A novel process is used to form the gold atom density gradient in which a shallow surface layer of phosphorus is diffused into the wafer and the shallow phosphorus diffusion is removed from one of the wafer surfaces. Gold is then plated onto the wafer and is sintered into the wafer through the phosphorus-free surface with a high gradient since gold atoms will not penetrate the wafer where the thin phosphorus coating remains.

7 Claims, 9 Drawing Figures

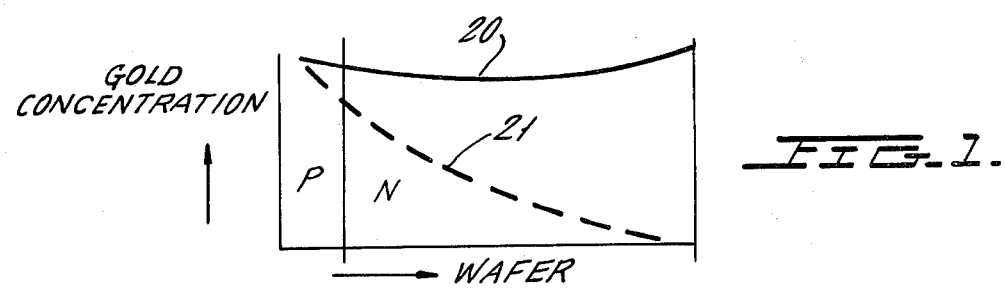
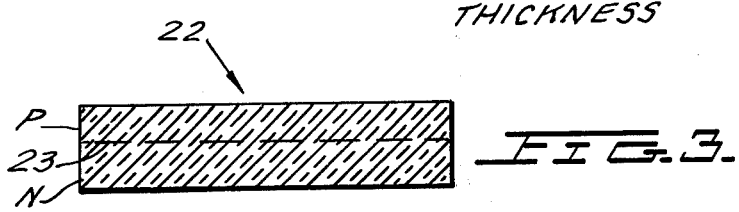
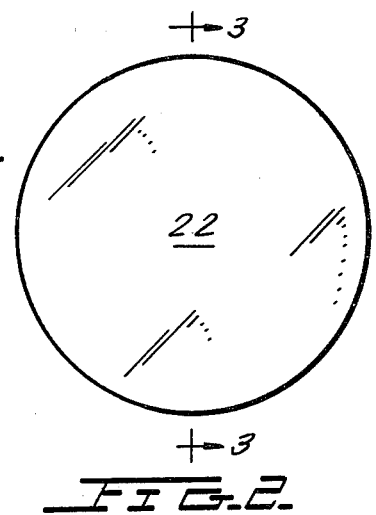
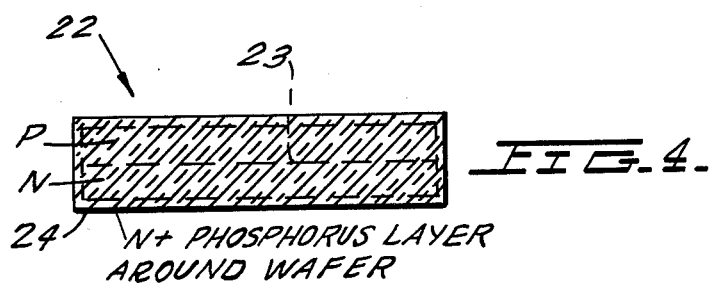
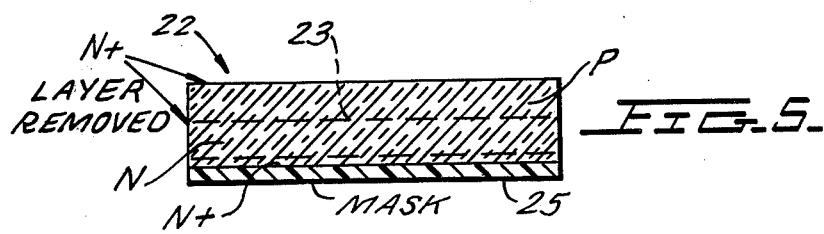
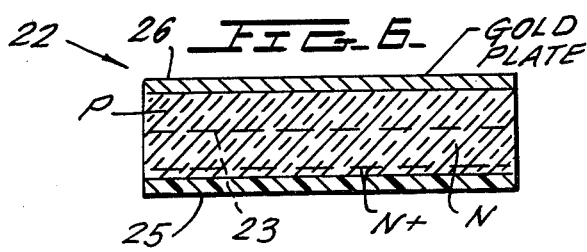
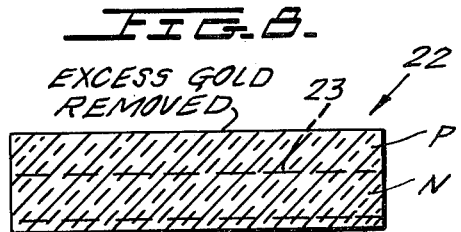
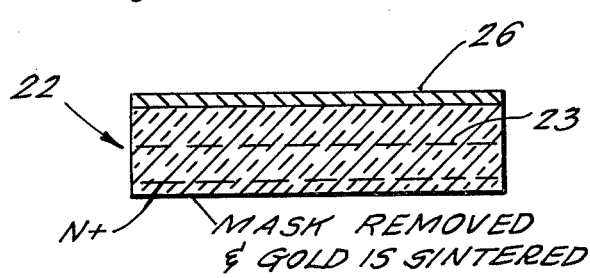
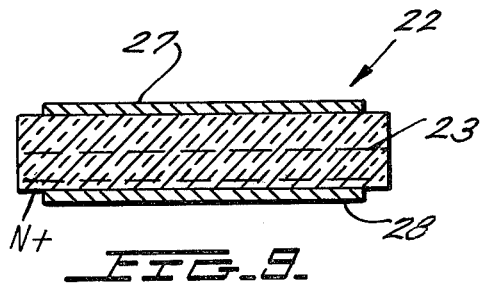

PROCESS FOR MANUFACTURE OF FAST RECOVERY DIODES

BACKGROUND OF THE INVENTION

This invention relates to semiconductor diode devices, and more specifically relates to a novel process for the manufacture of a fast recovery diode having soft turn-off characterisics.

It is well known that diffusion of gold into a semiconductor device will reduce the minority carrier lifetime in the device, thereby to make the turn-off time or recovery time of the diode much faster than in the absence of the gold. Gold atoms, however, have the property of diffusing very uniformly into and through the wafer so that the diode will turn off with a characteristic known as "hard turn-off" wherein the circuit containing the diode will experience high frequency oscillations during the turn-off time which can adversely affect the circuit characteristics.

It would be very desirable to construct a diode device with a fast recovery characteristic where, however, the turn-off is a soft turn-off rather than a hard turn-off so that the diode will stop conducting without producing adverse high peak voltage oscillations in the circuit containing the diode.

BRIEF DESCRIPTION OF THE PRESENT INVENTION

In accordance with the present invention, a high speed or fast recovery diode is provided with soft turn-off characteristics by causing a high gold atom density gradient across the wafer. Thus, gold gradient is obtained in a novel manner by first diffusing a shallow layer of phosphorus into the wafer and then removing the shallow phosphorus diffusion from one surface of the wafer. A source of gold created, for example, by gold-plating the wafer, is then placed on the phosphorus-free surface and the gold is then sintered into the device to diffuse gold atoms into the wafer. The remaining shallow phosphorus layer serves as a barrier to gold atoms attempting to pass through the coated surfaces and into the wafer, and permits the gold to be distributed across the wafer thickness with a high gradient. While arrangements using masks such as silicon diode masks around all but an exposed window of a wafer are known, these masks have not effectively served as a barrier to gold atoms during a gold diffusion process and the gold atoms diffuse easily through prior art oxide and nitride layers. Thus, gold atoms were uniformly distributed throughout the wafer body, thus leading to the hard turn-off condition described above.

BRIEF DESCRIPTION OF THE DRAWINGS

FIG. 1 is a plot showing gold concentration as a function of wafer thickness in solid line for a prior art type of fast recovery diode and in dotted line for a diode constructed in accordance with the process of the present invention.

FIG. 2 is a plan view of a silicon wafer having preformed a junction therein and which is to be prepared in accordance with the present invention.

FIG. 3 is a cross-sectional view of the wafer of FIG. 2 taken across the section line 3—3 in FIG. 2.

FIG. 4 is a cross-sectional view of the wafer of FIG. 3 after a shallow phosphorus diffusion around the periphery of the wafer.

FIG. 5 is a cross-sectional view of the wafer of FIG. 4 after the removal of the phosphorus layer from at least the top surface of the wafer.

FIG. 6 is a cross-sectional view similar to FIG. 5 showing the deposition of gold plate on top of the wafer of FIG. 5.

FIG. 7 is a view of the wafer of FIG. 6 after the removal of the mask from the bottom of the wafer and after the sintering of the gold into the wafer.

FIG. 8 is a view of the wafer of FIG. 7 after the removal of excess gold from the surface of the wafer.

FIG. 9 shows the wafer of FIG. 8 after the wafer has been completed by the placement of contacts thereon.

DETAILED DESCRIPTION OF THE DRAWINGS

Referring first to FIG. 1, line 20 illustrates gold concentration across a thin silicon wafer when using prior art gold doping techniques. Thus, gold has been used in order to reduce minority carrier lifetime but the gold atoms tend to diffuse into the wafer with a fairly uniform concentration across the wafer thickness. This uniform concentration of the gold tends to cause hard turn-off characteristics for the device which can lead to interference with the circuit which may contain the diode. Thus, when a device is doped with gold as shown by the solid line 20 in FIG. 1, the diode has a fast recovery, but there is a high frequency oscillation following the first current reversal.

It is desired to construct a diode device wherein gold is used to reduce minority carrier lifetime but wherein the gold concentration has the relatively steep gradient shown by the dotted line 21 in FIG. 1, whereby the diode will still have fast recovery but will have a soft turn-off which has a damped turn-off characteristic rather than a high frequency oscillation after the first current reversal. The reverse voltage pulse is typically reduced by a factor of about 2, for example, to about 400 V from about 1000 V.

The novel process of the invention for producing a high speed diode having a relatively sharp gold impurity distribution across the thickness of a wafer is described in connection with FIGS. 2 to 9. Referring first to FIGS. 2 and 3, there is illustrated therein a typical wafer which may have a diameter of 1" and a thickness of 12 mils and which has been prepared on an N-type monocrystalline silicon material which has a P-type upper region diffused therein to form the P-N junction 23. Any desired process can be used to make the device shown in FIGS. 2 and 3 with the junction 23 therein.

The wafer shown in FIGS. 2 and 3 is then prepared by lapping and by etching to bring the wafer to the desired thickness and cleanliness and the wafer is then loaded, with other similar wafers, into a suitable diffusion boat to have a thin layer of phosphorus diffused into its outer periphery, as shown in FIG. 4 by the phosphorus layer 24. In the following, a plurality of wafers will be simultaneously treated where possible. Layer 24 is formed by placing the wafer in a temperature zone of about 1100° C. within a diffusion furnace in the presence of phosphorus oxychloride (POCl$_3$) and nitrogen gas. The wafers remain in this atmosphere for about 1 hour and are then transferred to a cooling furnace where they are held at about 1150° C. for about 1 hour and then slowly cooled down to approximately 500° C. At the end of this operation, the thin phosphorus P+ region 24 will be formed around the wafer. Note that any other desired method could be used to form the shallow phosphorus region 24, and that the depth of region 24 can vary over a large range.

The wafer is then quickly cleaned in hydrofluoric acid for about 1 minute and is thereafter rinsed in distilled water for at least 5 minutes. Thereafter, a layer of suitable masking tape such as vinyl tape 25 is applied to the bottom surface of the wafer as shown in FIG. 5. The vinyl tape 25 is pressed firmly into full surface-to-surface contact with the wafer to insure that no gaps exist between the tape and wafer. Any other desired mask could be used in place of tape 25.

The masked wafer is then immersed in a suitable etching compound to remove the P+ layer from all parts of the wafer 22 which are not covered by the mask 25. This etching operation may consist of an initial etch in hydrofluoric acid for about 15 seconds followed by a thorough rinsing with distilled water, and followed by a still further etch in a mixture of 20 parts of nitric acid to 1 part hydrofluoric acid for another 15 seconds, followed again by a thorough rinse in distilled water.

The exposed side or the top side of the wafer in FIG. 5 is then tested with a suitable P and N tester to determine whether the P-type region above junction 23 has been exposed. If not, and if the measurement indicates an N-type region, the etching steps are repeated.

Following the removal of the N+ region 24 from the upper surface of the wafer in FIG. 5, the wafer is gold-plated as shown in FIG. 6 by any suitable plating operation to form the gold plate 26.

The wafer of FIG. 6 is then immersed in acetone and the vinyl mask 25 is carefully removed from the bottom of the wafer to expose the N+ phosphorus diffused region 25 as shown in FIG. 7. The acetone is then suitably removed from the wafer and the wafer is blown dry with nitrogen gas. The wafer is then loaded, with other similar wafers, into a sintering boat which is placed in a furnace set to a temperature of about 900 ± 30° C. The gold is then sintered for a sintering time of about 5–30 minutes, depending upon the temperature and performance parameters desired; 15 minutes is optimum, after being slowly admitted into the furnace over a period of about 5 minutes prior to the sintering period.

The wafer is then removed from the sintering furnace and allowed to cool slowly over a period of about 5 minutes and gold atoms will have diffused into the wafer with a gold concentration distribution gradient such as that shown in dotted line 21 of FIG. 1, where the gold concentration at the top of the wafer is high and the gold concentration at the bottom of the wafer adjacent the N+ phosphorus region is low.

The wafer of FIG. 7 is then suitably processed to remove excess gold in any desired manner and the wafers having the form shown in FIG. 8 are then cleaned. The processing of the wafers is completed, for example, as shown in FIG. 9 by the provision of metal contacts 27 and 28 on the opposite wafer surface. The wafer can then be suitably mounted in a housing of any desired type. In one example, sintering at 900° C. for 15 minutes will give a wafer having the following characteristics: resistivity 45–50 ohm cm; reverse recovery time 0.2 microseconds; and wafer thickness 11 mils.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

I claim:

1. A process for manufacture of a fast recovery diode having soft turn-off characteristics comprising the steps of forming at least one P-N junction in a semiconductor wafer, and thereafter diffusing a relatively thin phosphorus region into one surface of said wafer which region has a depth substantially less than the depth of said P-N junction, and thereafter diffusing gold into the opposite surface of said wafer, whereby said thin phosphorus region acts as a mask and prevents the diffusion of gold therethrough, and whereby said gold has a concentration gradient across said wafer.

2. The process of claim 1 wherein said thin phosphorus region has a depth which would be reached by heating said wafer in POCl$_3$ at a temperature of about 1100° C. for about one hour.

3. The process of claim 2 wherein said thin phosphorus region is formed over the full surface of said wafer, and is thereafter removed from said opposite surface of said wafer by etching.

4. The process of claim 2 wherein said one surface of said wafer is masked with an etch-resistant mask after formation of said phosphorus region, and wherein said phosphorus region in the unmasked surface regions of said wafer is removed by etching, and wherein gold is thereafter plated over the full surface of said wafer, and wherein said mask is thereafter removed, and gold is sintered into said wafer.

5. The process of claim 1 wherein said thin phosphorus region is formed over the full surface of said wafer, and is thereafter removed from said surface opposite said one surface by etching.

6. The process of claim 5 wherein gold is plated onto said opposite surface of said wafer and is sintered into said wafer at a temperature of about 900° C. for about fifteen minutes.

7. The process of claim 1 wherein gold is plated onto said opposite surface of said wafer and is sintered into said wafer at a temperature of about 900 ± 30° C. for about 5–30 minutes.

* * * * *